United States Patent [19]
Arleo et al.

[11] Patent Number: 5,176,790
[45] Date of Patent: Jan. 5, 1993

[54] PROCESS FOR FORMING A VIA IN AN INTEGRATED CIRCUIT STRUCTURE BY ETCHING THROUGH AN INSULATION LAYER WHILE INHIBITING SPUTTERING OF UNDERLYING METAL

[75] Inventors: Paul Arleo, Menlo Park; Jon Henri, San Jose; Graham Hills, Los Gatos; Jerry Wong, Fremont; Robert Wu, Pleasanton, all of Calif.

[73] Assignee: Applied Materials, Inc., Santa Clara, Calif.

[21] Appl. No.: 766,481

[22] Filed: Sep. 25, 1991

[51] Int. Cl.$^5$ .............. C03C 15/00; C03C 25/06; B44C 1/22
[52] U.S. Cl. .................... 156/643; 156/644; 156/657; 156/659.1; 252/79.1
[58] Field of Search ............. 156/643, 644, 646, 653, 156/657, 659.1, 662; 252/79.1; 204/192.32, 192.37; 430/317; 437/238

[56] References Cited
U.S. PATENT DOCUMENTS

| | | | |
|---|---|---|---|
| 4,668,338 | 5/1987 | Maydan et al. | 156/643 |
| 5,021,121 | 6/1991 | Groechel et al. | 156/643 |
| 5,022,958 | 6/1991 | Favreau et al. | 156/643 |

Primary Examiner—William A. Powell
Attorney, Agent, or Firm—John P. Taylor

[57] ABSTRACT

An improved process is described for forming one or more vias through an insulation layer by plasma etching to an underlying metal layer without depositing etch residues, including metal sputtered from the underlying metal layer, onto the sidewalls of the vias, which comprises, in one embodiment, using in the gaseous etchant one or more 3-6 carbon fluorinated hydrocarbons having the formula $C_xH_yF_z$, wherein x is 3 to 6, y is 0 to 3, and z is 2x-y when the fluorinated hydrocarbon is cyclic and z is 2x-y+2 when the fluorinated hydrocarbon is noncyclic. One or more other fluorine-containing gases may also be used as long as the 3-6 carbon fluorinated hydrocarbons comprise at least 10 volume % of the fluorine-containing gas mixture. The fluorinated hydrocarbon gas or fluorine-containing gas mixture also may be mixed with up to 90 volume % total of one or more inert gases to control the taper of the via walls. At least about 5 sccm of the total gas flow must comprise a 3-6 carbon fluorinated hydrocarbon gas, regardless of the volume % of 3-6 carbon fluorinated hydrocarbon gas in the total gas stream flow. In another embodiment, a controlled amount of one or more nitrogen-containing gases are used with one or more fluorine-containing etchant gas wherein the amount of nitrogen-containing gas ranges from about 1 volume part nitrogen-containing gas per 15 volume parts fluorine-containing gas to about 1 volume part nitrogen-containing gas per 2 volume parts fluorine-containing gas.

49 Claims, 2 Drawing Sheets

---

PROVIDING AN INTEGRATED CIRUIT STRUCTURE HAVING AN INSULATION LAYER FORMED OVER A METAL LAYER WITH A PHOTORESIST MASK OVER THE INSULATION LAYER

PLASMA ETCHING A VIA THROUGH THE INSULATION LAYER USING A MIXTURE OF ONE OR MORE NITROGEN-CONTAINING GASES AND ONE OR MORE FLUORINE-CONTAINING ETCHING GASES IN A RATIO OF FROM 1 VOLUME PART NITROGEN-CONTAINING GAS PER 15 VOLUME PARTS FLUORINE-CONTAINING GAS TO 1 VOLUME PART NITROGEN-CONTAINING GAS PER 2 VOLUME PARTS FLUORINE-CONTAINING GAS

```
┌─────────────────────────────────────┐
│  PROVIDING AN INTEGRATED CIRUIT     │
│  STRUCTURE HAVING AN INSULATION     │
│  LAYER FORMED OVER A METAL LAYER    │
│  WITH A PHOTORESIST MASK            │
│      OVER THE INSULATION LAYER      │
└─────────────────────────────────────┘
                   │
┌─────────────────────────────────────┐
│   PLASMA ETCHING A VIA THROUGH THE  │
│   INSULATION LAYER USING AN ETCHING │
│   GAS CONTAINING ONE OR MORE 3-6    │
│       CARBON FLUORINATED            │
│       HYDROCARBONS AND              │
│   OPTIONALLY CONTAINING ONE OR MORE │
│      ADDITIONAL FLUORINATED GASES   │
│   AND/OR ONE OR MORE NON-REACTIVE GASES │
└─────────────────────────────────────┘
```

FIGURE 1

```
┌─────────────────────────────────────┐
│  PROVIDING AN INTEGRATED CIRUIT     │
│  STRUCTURE HAVING AN INSULATION     │
│  LAYER FORMED OVER A METAL LAYER    │
│  WITH A PHOTORESIST MASK            │
│      OVER THE INSULATION LAYER      │
└─────────────────────────────────────┘
                   │
┌─────────────────────────────────────┐
│   PLASMA ETCHING A VIA THROUGH THE  │
│  INSULATION LAYER USING A MIXTURE OF│
│  ONE OR MORE NITROGEN-CONTAINING    │
│   GASES AND ONE OR MORE FLUORINE-   │
│   CONTAINING ETCHING GASES IN A     │
│   RATIO OF FROM 1 VOLUME PART       │
│      NITROGEN-CONTAINING GAS        │
│          PER 15 VOLUME PARTS        │
│   FLUORINE-CONTAINING GAS TO 1      │
│   VOLUME PART NITROGEN-CONTAINING   │
│   GAS PER 2 VOLUME PARTS            │
│   FLUORINE-CONTAINING GAS           │
└─────────────────────────────────────┘
```

PROCESS FOR FORMING A VIA IN AN INTEGRATED CIRCUIT STRUCTURE BY ETCHING THROUGH AN INSULATION LAYER WHILE INHIBITING SPUTTERING OF UNDERLYING METAL

BACKGROUND OF THE INVENTION

1. Field of the Invention

This invention relates to an improved process for etching a via through an insulation layer to a lower metal layer. More particularly, this invention relates to an improved process for etching one or more vias through an insulation layer to a lower metal layer which inhibits deposition of residues containing sputtered metal, on the sidewalls of the via.

2. Description of the Related Art

Conventionally vias are etched through a dielectric layer, such as an oxide or nitride layer, to interconnect an upper metal layer with a lower metal layer beneath the insulation layer using plasma assisted etching systems with, for instance, $CHF_3/O_2$, $CHF_3/CF_4$, $CHF_3/C_2F_6$, $CHF_3/He$, or $CHF_3/Ar$ chemistries. However, such processes usually result in the deposition of etch residues or "backsputtered polymer" on the sidewall of one or more of the vias, which residues may include sputtered metal from the underlying metal layer.

Such backsputtered polymer etch residues may occur due to previous planarization of the oxide layer through which the vias are etched. Such planarization can result in some portions of the underlying metal layer (which is not planarized) being closer to the surface of the planarized insulation layer than other portions of the underlying metal. As a result, all of the vias will not be of the same depth and the underlying metal in a shallow via will be exposed while the insulation layer is still being etched to form the deeper vias. If the etchant system is not highly selective, some of the exposed underlying metal in the shallow via will be sputtered while the deeper vias are still being formed, resulting in the undesired backsputtered polymer etch residues being deposited on the walls of such shallow vias.

These residues are impossible to remove with a standard plasma photoresist strip etch. The sputtered metal deposited on the sidewalls of the vias is usually not pure metal, but rather a mixture of the metal and other etch residues. Such deposited material tends to clog the vias, preventing or inhibiting dry plasma stripping of the vias and thus tend to adversely influence subsequent filling of the vias with conducting material to electrically interconnect the lower metal layer with other portions of the integrated circuit structure, e.g., an upper metal layer or interconnect.

These metal-containing residues cannot be removed in standard plasma resist strip process steps and thus additional wet chemical treatment are typically necessary. Such additional process complexity and potential increased defect levels are not desirable.

It would, therefore, be advantageous to provide an etching process for the formation of vias through an insulation layer to an underlying metal layer which inhibits sputtering of the underlying metal and deposition of such sputtered metal and/or other etch residues on the sidewalls of the vias.

SUMMARY OF THE INVENTION

The invention comprises an improved etch process for the formation of one or more vias in an insulation layer to an underlying metal layer without depositing etch residues, including metal sputtered from the underlying metal layer, onto the sidewalls of the vias, using a plasma assisted etch. In one embodiment, the process comprises the use of one or more fluorinated hydrocarbons having the formula $C_xH_yF_z$, wherein x is 3 to 6, y is 0-3, and z is 2x-y for cyclic compounds or 2x-y+2 for non-cyclic compounds.

The one or more $C_xH_yF_z$ gases may be used alone, in combination with one or more other fluorine-containing gases, in combination with one or more inert gases, or in combination with both. At least 50 volume % of the total amount of fluorine-containing gases used must have the formula $C_xH_yF_z$, and the total amount of fluorine-containing gases used in the gaseous mixture must be at least 40 volume % of the total mixture of gases flowing into the etch chamber during the etch process.

In another embodiment, the process comprises the use of a combination of a controlled amount of one or more nitrogen-containing gases in combination with one or more fluorine-containing etchant gases. The amount of the one or more nitrogen-containing gases used in the etchant mixture will vary from about 1 volume part of the one or more nitrogen-containing gases per 2 volume parts of the one or more fluorine-containing etchant gases to about 1 volume part of the one or more nitrogen-containing gases per 15 volume parts of the one or more fluorine-containing etchant gases.

BRIEF DESCRIPTION OF THE DRAWINGS

FIG. 1 is a flowsheet illustrating one embodiment of the process of the invention.

FIG. 2 is a flowsheet illustrating another embodiment of the process of the invention.

DETAILED DESCRIPTION OF THE INVENTION

Figure 3:
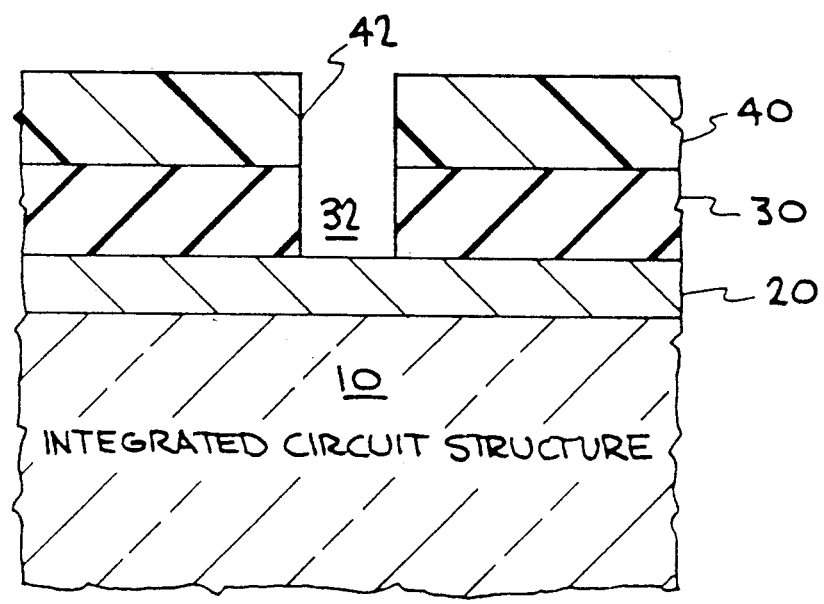
FIG. 3 is a fragmentary vertical cross-section of a portion of an integrated circuit structure showing the formation of a via through an insulation layer to an underlying metal layer utilizing the process of the invention.

The invention comprises an improved process for plasma etching one or more vias through an insulation layer to an underlying layer without depositing etch residues, including metal sputtered from the underlying metal layer, onto the sidewalls of the vias, in one embodiment by using one or more 3-6 carbon fluorinated hydrocarbons in the gaseous etchant, and in another embodiment by using a combination of a controlled amount of one or more nitrogen-containing gases and one or more fluorine-containing etchant gases. The process is of particular value when a plurality of vias are to be formed through a planarized insulation layer to underlying metal portions which may not all be at the same level beneath the planarized insulation layer, resulting in the exposure of underlying metal in shallow vias while deeper vias are still being formed.

By use of the term "insulation" is meant any nonconductive material used to electrically isolate the underlying metal layer or layers from other conductive materials. Usually the insulation material will comprise a deposited silicon oxide, such as, for example, an oxide formed by deposition of silicon oxide from a plasma excited mixture of tetraethylorthosilicate (TEOS) and O$_2$. The insulation material may also comprise a doped silicon oxide such as, for example, a phosphorus-doped silicon oxide. The insulation material may also comprise, for example, a silicon nitride compound or a silicon oxynitride compound formed over the metal layer.

The underlying metal layer or layers may comprise any one or combination of a number of metals, metal alloys, or metal compounds. Typically, an antireflective compound, such as a layer of a titanium nitride compound, may be located beneath the insulation layer for better lithography during subsequent processing, with one or more layers of metals such as aluminum, gold, titanium, or tungsten, or a metal mixture or alloy, such as, for example, titanium/tungsten, aluminum/silicon, or aluminum/silicon/copper provided underlying the antireflective metal-containing layer. Typically, the underlying metal layer will comprise aluminum.

One or more conventional fluorine-containing etchants capable of preferentially etching the insulation material through the photoresist mask may be used in connection with the practice of either embodiment of the invention. Examples of such fluorine-containing etchants which may be used include CHF$_3$, CF$_4$, C$_2$F$_6$, NF$_3$, SF$_6$, and mixtures of same.

Higher molecular weight fluorinated hydrocarbons may also be used as the fluorine-containing etchant in the practice of either embodiment of the invention and the use of same is required in the practice of one embodiment of the invention as will be described below. Higher molecular weight fluorinated hydrocarbons consist of 3-6 carbon fluorinated hydrocarbon compounds having the general formula C$_x$H$_y$F$_z$, wherein x is 3 to 6, y is 0 to 3, and z is 2x-y (for cyclic compounds) or 2x-y+2 (for non-cyclic compounds). Such 3-6 carbon fluorinated hydrocarbons comprise an organic molecule: containing either carbon and fluorine; or carbon, fluorine, and hydrogen; and which may be either cyclic or non-cyclic, but not aromatic.

Examples of cyclic 3-6 carbon fluorinated hydrocarbon compounds which may be included in the above formula are: C$_3$H$_3$F$_3$, C$_3$H$_2$F$_4$, C$_3$HF$_5$, C$_3$F$_6$, C$_4$H$_3$F$_5$, C$_4$H$_2$F$_6$, C$_4$HF$_7$, C$_4$F$_8$, C$_5$H$_3$F$_7$, C$_5$H$_2$F$_8$, C$_5$HF$_9$, C$_5$F$_{10}$, C$_6$H$_3$F$_9$, C$_6$H$_2$F$_{10}$, C$_4$HF$_{11}$, and C$_6$F$_{12}$. Examples of non-cyclic 3-6 carbon fluorinated hydrocarbons compounds which may be included in the above formula are: C$_3$H$_3$F$_5$, C$_3$H$_2$F$_6$, C$_3$HF$_7$, C$_3$F$_8$, C$_4$H$_3$F$_7$, C$_4$H$_2$F$_8$, C$_4$HF$_9$, C$_4$F$_{10}$, C$_5$H$_3$F$_9$, C$_5$H$_2$F$_{10}$, C$_5$HF$_{11}$, C$_5$F$_{12}$, C$_6$H$_3$F$_{11}$, C$_6$H$_2$F$_{12}$, C$_4$HF$_{13}$, and C$_6$F$_{14}$. Preferred among the above 3-6 carbon fluorinated hydrocarbon compounds is cyclooctofluorobutane (C$_4$F$_8$).

By use of the term "inert gases" herein is meant any rare gases such as helium, neon, argon, krypton, or xenon, although the use of argon or helium is preferred.

By use of the term "nitrogen-containing gas" herein is meant not only nitrogen itself, e.g., N$_2$, but also other nitrogen-containing gases such as, for example, N$_2$O, NO, NO$_2$, NH$_3$, and N$_2$H$_4$, provided, however, that the other reactive species generated from decomposition of such a nitrogen-containing gas in the plasma does not interfere with the process.

The total amount of etchant gas which is flowed into the etching chamber will vary somewhat depending upon the size of the chamber and the size of the wafer. Typically for an etching chamber of about 13 liters, the total gas flow may range from about 20 sccm to a maximum of about 500 sccm, and preferably will be kept below about 200 sccm. For other etch chambers, the gas flow rate may be adjusted, if needed.

The cathode support in the etch chamber may range in temperature from as low as about −120° C. to as high as about 50° C., but will usually range from about 5° C. to about 40° C., preferably from about 15° C. to about 25° C., and typically will range from about 18° C. to about 20° C.

The power level of the plasma associated with the etch chamber will vary with wafer size within a range of from about 300 to about 2500 watts, typically from about 500 to about 700 watts for a 6" wafer. By use of the expression "associated with the etch chamber", with respect to the plasma, is meant that the plasma may be generated either in the etch chamber itself or outside the etch chamber at some point in communication with the etch chamber, for example, a plasma generated in a microwave cavity upstream of the etch chamber in the gas flow stream, so that the reactive species produced in such a plasma will flow into the etch chamber.

The plasma etch may be used with or without magnetic enhancement such as described in Maydan et al. U.S. Pat. No. 4,668,338, assigned to the assignee of this invention. When such magnetic enhancement is used, the wafer may be immersed in a magnetic field having a magnetic strength component ranging from about 1 to about 150 gauss parallel to the plane of the wafer.

The pressure in the vacuum etch chamber during the etch process of the invention may range from about 5 milliTorr to about 200 milliTorr, and typically will be maintained at about 20 milliTorr. Higher pressures can be used up to, for example, about 1-2 Torr, provided that arcing does not occur between the electrodes in the etch chamber.

a. Use of One or More 3-6 Carbon Fluorinated Hydrocarbons in Etchant Gas Mixture In accordance with one embodiment of the process of the invention, the etchant gas used to form the vias in the insulation layer includes one or more 3-6 carbon fluorinated hydrocarbons having the general formula C$_x$H$_y$F$_x$, wherein x is 3 to 6, y is 0 to 3, and z is 2x-y (for cyclic compounds) or 2x-y+2 (for non-cyclic compounds), as previously defined above.

Such 3-6 carbon fluorinated hydrocarbons may comprise the total gaseous etchant, or they may be used in combination with other fluorine-containing gases and/or inert gases. When blended with other fluorine-containing gases, e.g., CHF$_3$, CF$_4$, NF$_3$, SF$_6$, C$_2$F$_6$, or mixtures of same, the amount of 3-6 carbon fluorinated hydrocarbons will always comprise at least 10 volume % of the mixture of fluorine-containing gases, i.e., the other fluorine-containing gases will not exceed 90 volume % of the mixture of fluorine-containing gases.

The amount of inert gases which may be mixed with either the 3-6 carbon fluorinated hydrocarbons, or mixture of 3-6 carbon fluorinated hydrocarbons and other fluorine-containing gases, may vary from 0 to 90 volume % of the total amount of gases in the mixture.

Preferably from about 30 to 50 volume % of the total gases used in the etchant gas mixture will comprise an inert gas. It has been found that the presence of such inert gases in the etchant gas mixture results in the etching of a via substantially without a taper. When the fluorine-containing gases are used without being diluted with such inert gases, the resulting via may be tapered inwardly toward the bottom of the via by as much as 20° from the vertical.

A controlled amount of one or more nitrogen-containing gases, preferably $N_2$, may also be added to the etchant gas mixture as well to control the taper of the vias. When one or more nitrogen-containing gases are added to the etchant gas mixture, the amount of such nitrogen-containing gases which may be added should not exceed about 1 part by volume of the one or more nitrogen-containing gases per 2 parts by volume of the other gases in the mixture. The presence of a controlled amount of such one or more nitrogen-containing gases in the etchant gas mixture has also been found to inhibit or eliminate the formation of etch residues and backsputtering of metal during formation of the vias, as will be described below.

When the one or more 3-6 carbon fluorinated hydrocarbon gases are used with another fluorine-containing gas and/or an inert gas, in this embodiment of the invention, with or without the one or more nitrogen-containing gases, at least about 5 sccm of the total gas flow must comprise the one or more 3-6 carbon fluorinated hydrocarbon gases, regardless of the volume % of the one or more 3-6 carbon fluorinated hydrocarbon gases to the remainder of the gases in the total gas stream flow.

FIG. 3 shows an integrated circuit structure having a via formed therein by the process of the invention. An underlying integrated circuit structure, which may comprise a number of active and passive components is generally indicated at numeral 10 having a first metal interconnect layer 20 formed thereon. An insulation layer 30 has been deposited over metal layer 20 and a photoresist mask 40, having an opening 42, is formed over dielectric layer 30. As shown, utilizing the process of the invention, a via 32 has been formed in insulation layer 30 which is free of sputtered metal etch residues. It will be noted that the via walls are shown as perpendicular to the surface of the insulation layer, indicating that the fluorine-containing etch gas of the invention has been mixed with a sufficient amount of one or more inert gases or one or more nitrogen-containing gases to provide the desired anisotropicity.

b. Use of One or More Nitrogen-Containing Gases in Combination With One or More Fluorine-Containing Etchant Gases In accordance with a second embodiment of the process of the invention, the formation of etch residues or backsputtered metal on the sidewalls of vias formed in an insulation layer over a metal-containing layer is inhibited or prevented by the use of a combination of a controlled amount of one or more nitrogen-containing gases and one or more fluorine-containing etchant gases.

The amount of such nitrogen-containing gas or gases used in the mixture of nitrogen-containing and fluorine-containing etchant gases may vary from as little as 1 part by volume of one or more nitrogen-containing gases per 15 parts by volume of one or more fluorine-containing gases, to as much as 1 part by volume of one or more nitrogen-containing gases per 2 parts by volume one or more fluorine-containing gases, i.e., from a 1:15 volume ratio of nitrogen-containing gas (or gases):-fluorine-containing etchant gas (or gases) to a 1:2 volume ratio.

Typically the flow of such one or more nitrogen gases into a 13 liter etching chamber will range from about 3 to about 5 sccm of nitrogen-containing gas or gases, and the flow of fluorine-containing etchant gas or gases, such as $CF_4$, will range from about 10 to about 50 sccm. When more than one fluorine-containing etchant gas is used, typically the flow of each fluorine-containing etchant gas into the etch chamber will range from about 10 to about 50 sccm.

The amount of the one or more nitrogen-containing gases used in the process must be at least 1 part by volume nitrogen-containing gas or gases to 15 parts by volume fluorine-containing gas or gases, i.e., a 1:15 volume ratio, to provide the desired etch residues prevention which characterizes the process of the invention. On the other hand, however, the total amount of nitrogen-containing gas or gases used in the process should not exceed 1 part by volume nitrogen-containing gas or gases to 2 parts by volume fluorine-containing gas or gases, i.e., a 1:2 volume ratio, because greater amounts of nitrogen present in the gaseous mixture can deleteriously affect the preferential etching of the oxide layer over the photoresist mask. That is, greater amounts of nitrogen, present in the gaseous mixture from the nitrogen-containing gas or gases, can result in undesirable etching of the photoresist mask as well as the desired etching of the underlying oxide layer, resulting in loss of resolution or dimension control of the diameter of the vias.

Such mixtures of nitrogen-containing gas or gases and fluorine-containing etchant gas or gases may comprise the total gaseous etchant mixture, or the mixture may be used in combination with one ore more inert gases, preferably argon or helium. When blended with such inert gases, the amount of such inert gases typically should not exceed about 94 volume % of the total mixture of gases, i.e., the mixture of nitrogen-containing gas or gases and fluorine-containing etchant gas or gases must be at least 6 volume % of the total mixture of gases. Preferably, the amount of the inert gas in the total gas mixture ranges from about 30 volume % to about 50 volume %.

EXAMPLE I

To further illustrate the process of the invention, a layer of silicon oxide having an average thickness of about 1 micron was formed over an aluminum layer on a 5" diameter wafer by conventional $TEOS/O_2$ deposition followed by application of a photoresist mask with a 1.5 micron diameter opening therein. A via was etched in the oxide layer by flowing an etchant gas mixture of 50 volume % $C_4F_8$ and 50 volume % helium into an Applied Materials 5000 MERIE etch chamber at a rate of about 50 sccm while maintaining a plasma in the chamber at a power level of about 650 watts and using magnetic enhancement at about a 80 gauss level. The chamber was maintained at a pressure of about 10 milliTorr and a cathode temperature of about 20° C. during the etch. The etch was carried out while monitoring the 4835 Angstrom CO line for an endpoint which took about 2½ minutes to reach.

After removal of the etched wafer from the etch chamber, the resulting via was examined by SEM and found to be free of any traces of etch residues, including sputtered metal, on the sidewalls of the via. The sidewalls of the via were further found to be close to perpendicular to the surface of the underlying metal layer.

EXAMPLE II

A layer of silicon oxide having an average thickness of about 1 micron was formed over from about 200 to 500 Angstroms of a titanium nitride antireflective layer formed over an aluminum layer on a 6" diameter wafer by conventional TEOS/$O_2$ deposition followed by application of a photoresist mask with a 1.5 micron diameter opening therein. Vias were etched in the oxide layer by flowing an etchant gas mixture, comprising about 3 sccm of $N_2$, about 25 sccm of $CHF_3$, about 5 sccm of $CF_4$, and about 75 sccm of argon, into an Applied Materials 5000 MERIE etch chamber while maintaining a plasma in the chamber at a power level of about 600 watts and using magnetic enhancement at about a 80 gauss level. The chamber was maintained at a pressure of about 20 milliTorr and a cathode temperature of about 20° C. during the etch. The etch was carried out while monitoring the 4835 Angstrom CO line for an endpoint which took about 2½ minutes to reach.

After removal of the etched wafer from the etch chamber, the resulting vias were examined by SEM and found to be free of any traces of etch residues, including sputtered metal, on the sidewalls of the vias. The sidewalls of the vias were further found to be close to perpendicular to the surface of the underlying metal layers.

EXAMPLE III

The process of Example II was repeated except that the flow of $N_2$ gas into the etch chamber was reduced to 1 sccm during the etch. When the resulting vias were examined by SEM, they were found to have etch residues, which included sputtered titanium, on the sidewalls of the vias, indicating that the nitrogen flow was insufficient to inhibit backsputtering and deposition of etch residues on the sidewalls of the vias.

EXAMPLE IV

The process of Example II was again repeated except that the flow of $N_2$ gas into the etch chamber was increased to 20 sccm during the etch, i.e., an $N_2$ to fluorinated hydrocarbon ratio of 1.6:2. When the resulting vias were examined by SEM, they were found to be free of etch residues. However, erosion of the photoresist mask openings was noted, and in some instances the diameter of the vias was greater than the vias formed in Example I, indicating that the excessive amount of $N_2$ used in the gaseous etchant mixture reduced the selectivity of the etchant, resulting in both the photoresist mask and underlying oxide layer being etched by the gaseous etchant mixture.

Thus, the process of the invention provides a means for forming one or more vias through an insulation layer to an underlying metal layer without sputtering metal onto the sidewalls of the via or forming etch residues on the via sidewall either by using one or more 3-6 carbon fluorinated hydrocarbons in the etchant gas, a controlled amount of one or more nitrogen-containing gases in combination with one or more fluorine-containing etchant gases, or a combination thereof. Furthermore, the sidewalls of the via can be formed perpendicular to the surface of the insulation layer either by controlling the ratio of the fluorine-containing gas or gases to inert gas, or by the use of a controlled amount of nitrogen-containing gas or gases in the etchant gas.

Having thus described the invention what is claimed is:

1. A process for forming one or more vias by etching through an insulation layer over a metal layer on a semiconductor wafer in an etch chamber without depositing sputtered metal or other etch residues on the sidewall of the via which comprises plasma etching said insulation layer with a fluorine-containing gaseous etchant mixture which includes one or more etch residue inhibitors selected from the group consisting of:
   a) one or more nitrogen-containing gases, in an amount ranging from about 1 part by volume nitrogen-containing gas to 2 parts by volume of other gases in said mixture to 1 part by volume nitrogen-containing gas to about 15 parts by volume of other gases in said mixture;
   b) one or more 3-6 carbon fluorinated hydrocarbon gases; and
   c) mixtures of same.

2. The process of claim 1 wherein said one or more nitrogen-containing gases are selected from the group consisting of $N_2$ and $N_2O$.

3. The process of claim 1 wherein said one or more 3-6 carbon fluorinated hydrocarbon gases include $C_4F_8$.

4. A process for forming one or more vias by etching through an insulation layer over a metal layer on a semiconductor wafer in an etch chamber without depositing sputtered metal or other etch residues on the sidewall of the via which comprises etching said insulation layer with a gaseous mixture which includes one or more 3-6 carbon fluorinated hydrocarbons.

5. The process of claim 4 wherein said step of forming said via with a gaseous mixture which includes one or more 3-6 carbon fluorinated hydrocarbons further comprises etching said insulation layer with a gaseous mixture which includes one or more fluorinated hydrocarbons having the formula $C_xH_yF_z$, wherein x is 3 to 6, y is 0 to 3, and z is 2x-y when said fluorinated hydrocarbon is cyclic and 2x-y+2 when said fluorinated hydrocarbon is non-cyclic.

6. The process of claim 5 wherein said step of forming said via with an etch gas mixture which include one or more of said 3-6 carbon fluorinated hydrocarbons further comprises etching said insulation layer with a fluorinated hydrocarbon having the formula $C_4F_8$.

7. The process of claim 5 wherein said step of forming said via with an etch gas mixture which include one or more of said 3-6 carbon fluorinated hydrocarbons further includes maintaining a plasma associated with said etch chamber within a power range of from about 300 to about 2500 watts.

8. The process of claim 7 wherein said step of forming said via with a gaseous mixture which includes one or more 3-6 carbon fluorinated hydrocarbons further comprises etching said insulation layer with a gaseous mixture which includes a mixture of said one or more 3-6 fluorinated gases and one or more other fluorine-containing gases wherein at least 10 volume % of said mixture of fluorine-containing gases comprises said one or more 3-6 carbon fluorinated hydrocarbons.

9. The process of claim 7 wherein said step of forming said via with a gaseous mixture which includes one or more 3-6 carbon fluorinated hydrocarbons further comprises etching said insulation layer with a gaseous mixture which includes a mixture of said one or more 3-6 fluorinated hydrocarbons and optionally one or more inert gases wherein the amount of said inert gases comprise from 0 to about 90 volume % of said gaseous mixture.

10. The process of claim 7 wherein said step of forming said via with a gaseous mixture which includes one or more 3-6 carbon fluorinated hydrocarbons further comprises etching said insulation layer with a etchant gas mixture which includes:

a) a fluorinated hydrocarbon mixture of said one or more 3-6 carbon fluorinated hydrocarbons and one or more other fluorine-containing gases wherein at least 10 volume % of said fluorine-containing gases in said mixture comprises said one or more 3-6 carbon fluorinated hydrocarbons; and b) optionally one or more inert gases wherein the amount of said inert gases comprises from 0 to about 90 volume % of the total volume of said gaseous mixture of fluorine-containing gases and inert gases;

provided, however, that said etchant gas mixture flowing into said etching chamber includes at least 5 sccm of said one or more 3-6 carbon fluorinated hydrocarbons.

11. The process of claim 10 wherein the amount of said inert gas in said etch gas mixture ranges from about 30 volume % to about 50 volume %.

12. The process of claim 7 wherein the pressure in said etch chamber ranges from about 5 milliTorr to about 200 milliTorr.

13. The process of claim 7 wherein the temperature of a wafer support in said etch chamber on which said wafer is mounted ranges from about $-120°$ C. to about $50°$ C.

14. The process of claim 13 wherein the temperature of said wafer support in said etch chamber ranges from about $5°$ C. to about $40°$ C.

15. The process of claim 7 wherein the total flow of etch gas into said etch chamber is equivalent to a gas flow into a 13 liter chamber of from about 20 to about 300 sccm.

16. The process of claim 7 wherein said etch is carried out while subjecting said wafer to a magnetic field having a magnetic strength component parallel to the plane of said wafer ranging from about 1 to about 150 gauss.

17. A process for forming a via by etching through an insulation layer over a metal layer on a semiconductor wafer in an etch chamber without depositing sputtered metal residues on the sidewall of the via which comprises:

a) flowing into said etch chamber an etch gas mixture which includes:

i) from about 10 to about 100 volume % of one or more 3-6 carbon fluorinated hydrocarbons having the formula $C_xH_yF_z$, wherein x is 3 to 6, y is 0 to 3, and z is 2x-y when said fluorinated hydrocarbon is cyclic and 2x-y+2 when said fluorinated hydrocarbon is non-cyclic; and ii) optionally from 0 to about 90 volume % of one or more inert gases; and b) maintaining a plasma within said etch chamber during said etch within a power range of from about 300 to about 2500 watts.

18. The process of claim 17 wherein said step of flowing into said etch chamber a gaseous mixture which includes said one or more fluorine-containing gases comprising from about 10 to about 100 volume % of said one or more 3-6 carbon fluorinated hydrocarbons further comprises flowing into said etch chamber a fluorinated hydrocarbon having the formula $C_4F_8$.

19. The process of claim 17 wherein said gaseous mixture further includes one or more other fluorine-containing gases wherein at least 10 volume % of the total of said fluorine-containing gases in said mixture comprise said one or more 3-6 carbon fluorinated hydrocarbons, provided, however, that said etch gas mixture flowing into said etching chamber includes at least 5 sccm of said one or more 3-6 carbon fluorinated hydrocarbons.

20. The process of claim 17 wherein the amount of inert gas in said gaseous mixture ranges from about 30 volume % to about 50 volume % of the total volume of said mixture.

21. The process of claim 17 wherein the total flow of said gaseous mixture into said etch chamber is equivalent to a gas flow into a 13 liter chamber of from about 20 to about 300 sccm.

22. The process of claim 17 wherein said etch gas mixture flowing into said etching chamber includes at least 5 sccm of said one or more 3-6 carbon fluorinated hydrocarbons.

23. The process of claim 17 wherein said etch is carried out while immersing said wafer in a magnetic field having a magnetic strength parallel to the plane of said wafer ranging from about 1 to about 150 gauss.

24. The process of claim 17 wherein the pressure in said etch chamber ranges from about 5 milliTorr to about 200 milliTorr and the temperature of a wafer support in said etch chamber on which said wafer rests ranges from about $-120°$ C. to about $50°$ C.

25. The process of claim 24 wherein the temperature of said wafer support in said etch chamber ranges from about $5°$ C. to about $40°$ C.

26. A process for forming a via by etching through an insulation layer over a metal layer on a semiconductor wafer in an etch chamber without depositing sputtered metal or other etch residues on the sidewall of the via which comprises:

a) flowing into said etch chamber a gaseous mixture which includes:

i) one or more fluorine-containing gases comprising from about 10 to about 100 volume % of one or more 3-6 carbon fluorinated hydrocarbons having the formula $C_xH_yF_z$, wherein x is 3 to 6, y is 0 to 3, and z is 2x-y when said fluorinated hydrocarbon is cyclic and 2x-y+2 when said fluorinated hydrocarbon is non-cyclic;

ii) from 0 to about 90 volume % of one or more other fluorine-containing gases; and iii) one or more inert gases wherein the amount of said inert gases comprise from 0 to about 90 volume % of the total volume of said gaseous mixture of fluorine-containing gases and inert gases;

b) maintaining a plasma within said etch chamber during said etch within a power range of from about 300 to about 2500 watts; and c) immersing said wafer in a magnetic field having a magnetic strength parallel to the plane of said wafer ranging from 1 to about 150 gauss.

27. The process of claim 25 wherein said step of flowing into said etch chamber a gaseous mixture which includes one or more fluorine-containing gases comprising from about 10 to about 100 volume % of one or more 3-6 carbon fluorinated hydrocarbons further comprises flowing into said etch chamber a fluorinated hydrocarbon having the formula $C_4F_8$.

28. A method for forming one or more vias by etching through an insulation layer over a metal layer on a semiconductor wafer in an etch chamber without depositing sputtered metal or other etch residues on the sidewall of said vias which comprises etching said insulation layer with an etchant gas mixture which includes one or more fluorine-containing etchant gases and one or more nitrogen-containing gases present in an amount ranging from about 1 volume part of said one or more nitrogen-containing gases per 15 volume parts of said one or more fluorine-containing gases to about 1 volume part of said one or more nitrogen-containing gases per 2 volume parts of said one or more fluorine-containing gases.

29. The process of claim 28 wherein said step of forming said via with said etchant gas mixture further includes maintaining a plasma associated with said etch chamber within a power range of from about 300 to about 2500 watts.

30. The process of claim 29 wherein said one or more nitrogen-containing gases are selected from the group consisting of $N_2$ and $N_2O$.

31. The process of claim 29 wherein said one or more nitrogen-containing gases consist essentially of $N_2$.

32. The process of claim 29 wherein said step of forming said vias with an etchant gas mixture of said one or more nitrogen-containing gases and said one or more fluorinated hydrocarbons further comprises etching said insulation layer with a gaseous mixture which further includes one or more inert gases wherein the amount of said one or more inert gases comprise from 1 to about 94 volume % of the total volume of said gaseous mixture.

33. The process of claim 32 wherein the amount of said one or more inert gases in said gas mixture ranges from about 30 volume % to about 50 volume %.

34. The process of claim 29 wherein the flow of said gases into said etch chamber is equivalent to a gas flow into a 13 liter chamber of from about 2 to about 3 sccm of said one or more nitrogen-containing gases, and from about 20 to about 30 sccm of each of said one or more fluorinated hydrocarbon gases.

35. The process of claim 29 wherein said one or more fluorine-containing gases are selected from the group consisting of $CHF_3$, $CF_4$, $C_2F_6$, mixtures of same, and $SF_6$.

36. The process of claim 29 wherein said one or more fluorine-containing gases comprise one or more 1-6 carbon fluorinated hydrocarbons.

37. The process of claim 36 wherein said one or more fluorine-containing gases are selected from the group consisting of $CHF_3$, $CF_4$, $C_2F_6$, $NF_3$, $SF_6$, and mixtures of same.

38. The process of claim 36 wherein said one or more fluorine-containing gases comprise one or more 3-6 carbon fluorinated hydrocarbons having the formula $C_xH_yF_z$, wherein x is 3 to 6, y is 0 to 3, and z is 2x-y when said fluorinated hydrocarbon is cyclic and 2x-y+2 when said fluorinated hydrocarbon is non-cyclic.

39. The process of claim 36 wherein said one or more fluorine-containing gases comprise a mixture of one or more 3-6 carbon fluorinated hydrocarbons and one or more other fluorinated gases wherein at least 10 volume % of said fluorinated gases in said mixture comprises said one or more 3-6 carbon fluorinated hydrocarbons.

40. The process of claim 29 wherein the pressure in said etch chamber ranges from about 5 milliTorr to about 200 milliTorr.

41. The process of claim 29 wherein the temperature of a wafer support in said etch chamber on which said wafer is mounted ranges from about $-120°$ C. to about $50°$ C.

42. The process of claim 41 wherein the temperature of said wafer support in said etch chamber ranges from about $5°$ C. to about $40°$ C.

43. The process of claim 29 wherein said etch is carried out while subjecting said wafer to a magnetic field having a magnetic strength parallel to the plane of said wafer ranging from 1 to about 150 gauss.

44. A method for forming one or more vias by etching through an insulation layer over a metal layer on a semiconductor wafer in an etch chamber without depositing sputtered metal residues on the sidewall of the via which comprises:
 a) flowing into said etch chamber containing said semiconductor wafer an etch gas mixture which includes:
  i) one or more fluorine-containing etchant gases; and
  ii) one or more nitrogen-containing gases selected from the group consisting of $N_2$ and $N_2O$;
 in a ratio ranging from about 1 volume part of said one or more nitrogen-containing gases per 15 volume parts of said one or more fluorine-containing gases to about 1 volume part of said one or more nitrogen-containing gases per 2 volume parts of said fluorine-containing gases; and
 b) maintaining a plasma within said etch chamber during said etch within a power range of from about 300 to about 2500 watts.

45. The process of claim 44 wherein said one or more nitrogen-containing gases consist essentially of $N_2$.

46. The process of claim 44 wherein said one or more fluorine-containing gases are selected from the group consisting of $CHF_3$, $CF_4$, $C_2F_6$, $NF_3$, $SF_6$, and mixtures of same.

47. The process of claim 44 wherein said one or more fluorine-containing gases comprise one or more 1-6 carbon fluorinated hydrocarbons.

48. The process of claim 44 wherein said gas mixture further includes one or more inert gases wherein the amount of said inert gases comprise from 1 to about 94 volume % of the total volume of said gas mixture.

49. A method for forming one or more vias by etching through an insulation layer over a metal layer on a semiconductor wafer in an etch chamber without depositing sputtered metal residues on the sidewall of the via which comprises:
 a) flowing into said etch chamber containing said semiconductor wafer an etch gas mixture which includes:
  i) one or more fluorine-containing etchant gases selected from the group consisting of $CHF_3$, $CF_4$, $C_2F_6$, $NF_3$, $SF_6$, and mixtures of same;
  ii) $N_2$ gas; and
  iii) optionally from 0 to about 94 volume % of an inert gas;
  in an $N_2$ to fluorine-containing gas ratio ranging from about 1 volume part $N_2$ gas per 15 volume parts fluorine-containing gas to about 1 volume part $N_2$ gas per 2 volume parts fluorine-containing gas;
 b) maintaining said etch chamber at a pressure ranging from about 5 milliTorr to about 200 milliTorr during said etch;
 c) maintaining the temperature of a wafer support in said etch chamber on which said wafer is mounted within a range of from about $-120°$ C. to about $50°$ C. during said etch;
 d) immersing said wafer in a magnetic field having a magnetic strength parallel to the plane of said wafer ranging from 0 to about 150 gauss during said etch; and
 e) maintaining a plasma within said etch chamber during said etch within a power range of from about 300 to about 2500 watts.

* * * * *